US010129975B1

(12) United States Patent
Tabor et al.

(10) Patent No.: US 10,129,975 B1
(45) Date of Patent: Nov. 13, 2018

(54) LIQUID METAL INTERFACES FOR FLEXIBLE AND RECONFIGURABLE ELECTRONICS

(71) Applicant: The United States of America, as represented by the Secretary of the Air Force, Washington, DC (US)

(72) Inventors: Christopher Tabor, Kettering, OH (US); Nahid Ilyas, Lexington Pk, MD (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 15/939,356

(22) Filed: Mar. 29, 2018

Related U.S. Application Data

(60) Provisional application No. 62/479,620, filed on Mar. 31, 2017.

(51) Int. Cl.
*H05K 1/02* (2006.01)
*H05K 1/09* (2006.01)
(Continued)

(52) U.S. Cl.
CPC ......... *H05K 1/0272* (2013.01); *H01B 7/0027* (2013.01); *H05K 1/028* (2013.01); *H05K 1/09* (2013.01); *C22C 30/00* (2013.01)

(58) Field of Classification Search
CPC ........ H05K 1/0272; H05K 1/028; H05K 1/09; H01B 7/0027
(Continued)

(56) References Cited

U.S. PATENT DOCUMENTS

| 5,980,776 A * | 11/1999 | Zakikhani | A61K 6/0023 |
| | | | 252/175 |
| 2014/0202531 A1* | 7/2014 | Oya | H01B 1/22 |
| | | | 136/256 |

OTHER PUBLICATIONS

Hotchkiss, The Modification of Indium Tin Oxide with Phosphonic Acids: Mechanism of Binding, Tuning of Surface Properties, Accounts of Chemical Research, 2011.
(Continued)

*Primary Examiner* — Timothy Thompson
*Assistant Examiner* — Charles Pizzuto
(74) *Attorney, Agent, or Firm* — AFMCLO/JAZ; Timothy Barlow

(57) ABSTRACT

A reconfigurable electronic component comprising a channel having first and second ends and outer walls defining a lumen; a liquid phosphonic acid within the lumen; and a liquid metal within the lumen. A first electrical contact at the first end of the channel and a second electrical contact in communication with the lumen at the second end of the channel. A predetermined amount of a solvent and a liquid metal may be within the lumen, and the solvent may comprise ethanol. The liquid metal may be selected from the group consisting of eutectic gallium indium (EGaIn) and eutectic gallium-indium-tin alloys. The phosphonic acid may be selected from the group consisting of decylphosphonic acid (DPA), fluorobenzylphosphonic acid (FPA), and difluorobenzylphosphonic acid (DFPA). The first and second electrical contacts comprise copper. An overflow channel and a reservoir for the liquid metal and phosphonic acid may be in fluid communication with the lumen.

10 Claims, 16 Drawing Sheets
(16 of 16 Drawing Sheet(s) Filed in Color)

(51) Int. Cl.
   *H01B 7/00*   (2006.01)
   *C22C 30/00*   (2006.01)

(58) Field of Classification Search
   USPC .......................................................... 174/9 R
   See application file for complete search history.

(56) References Cited

OTHER PUBLICATIONS

So, Ionic Current Rectification in Soft-Matter Diodes with Liquid-Metal Electrodes, Advanced Functional Materials, 2012, 22, 625-631.
Xu, Effect of oxidation on the mechanical properties of liquid gallium and eutectic gallium-indium, Physics of Fluids, 2012, 24.
Dickey, Eutectic gallium-indium (EGaIn): A Liquid Metal Allow formation of stable structures in microchannels at room temperature, Adv. Funct. Mater., 2008.
Ladd, 3D printing of free standing liquid metal structures, Adv. Mater. 2013, 25.
Cademartiri, Electrical resistance of AgTS—S(CH2)n-1CH3//Ga2O3/EGaIn Tunneling Junctions, J. Phys. Chem C, 2012, 116.
Li, A galinstan-based inkjet printing system for highly stretchable electronics with self-healing capability, Lab. Chip, 2016, 16.
Paniagua, Phosphonic Acids for Interfacial Engineering of Transparent Conductive Oxides, Cm. Rev., 2016, 116.

\* cited by examiner

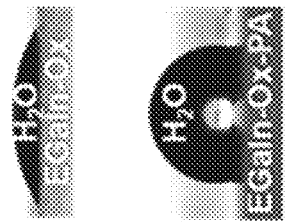
FIG. 1A
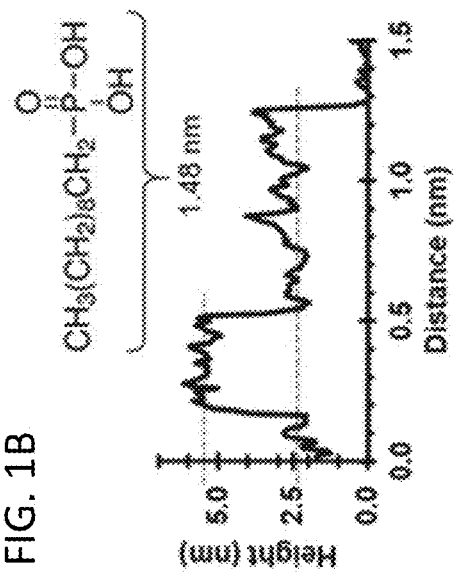
FIG. 1B
FIG. 1C
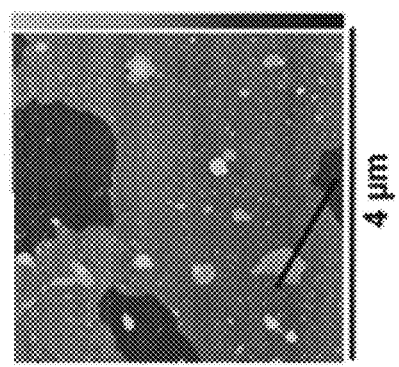
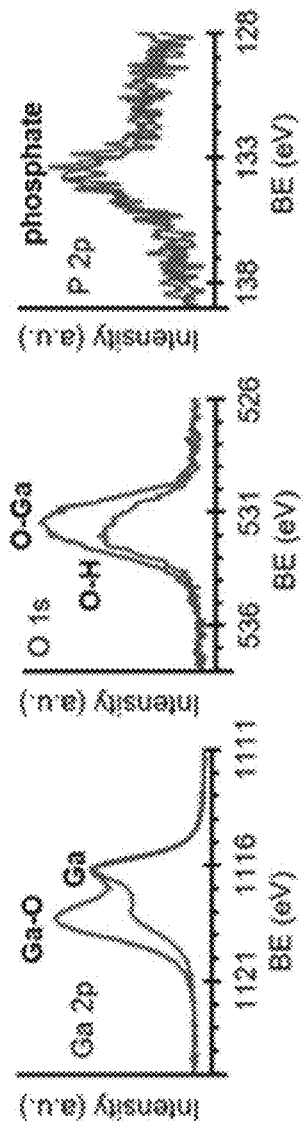
FIG. 1D

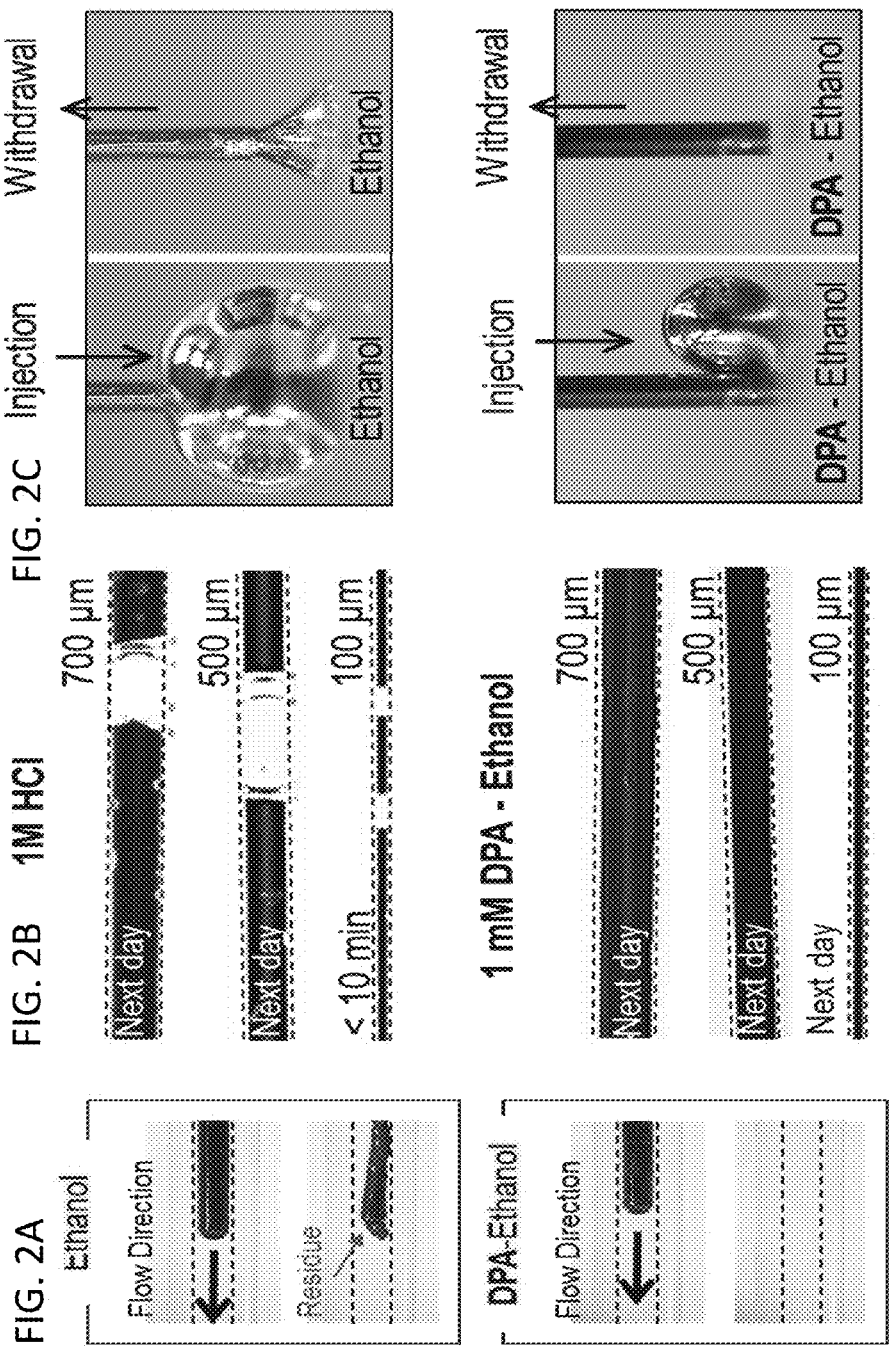

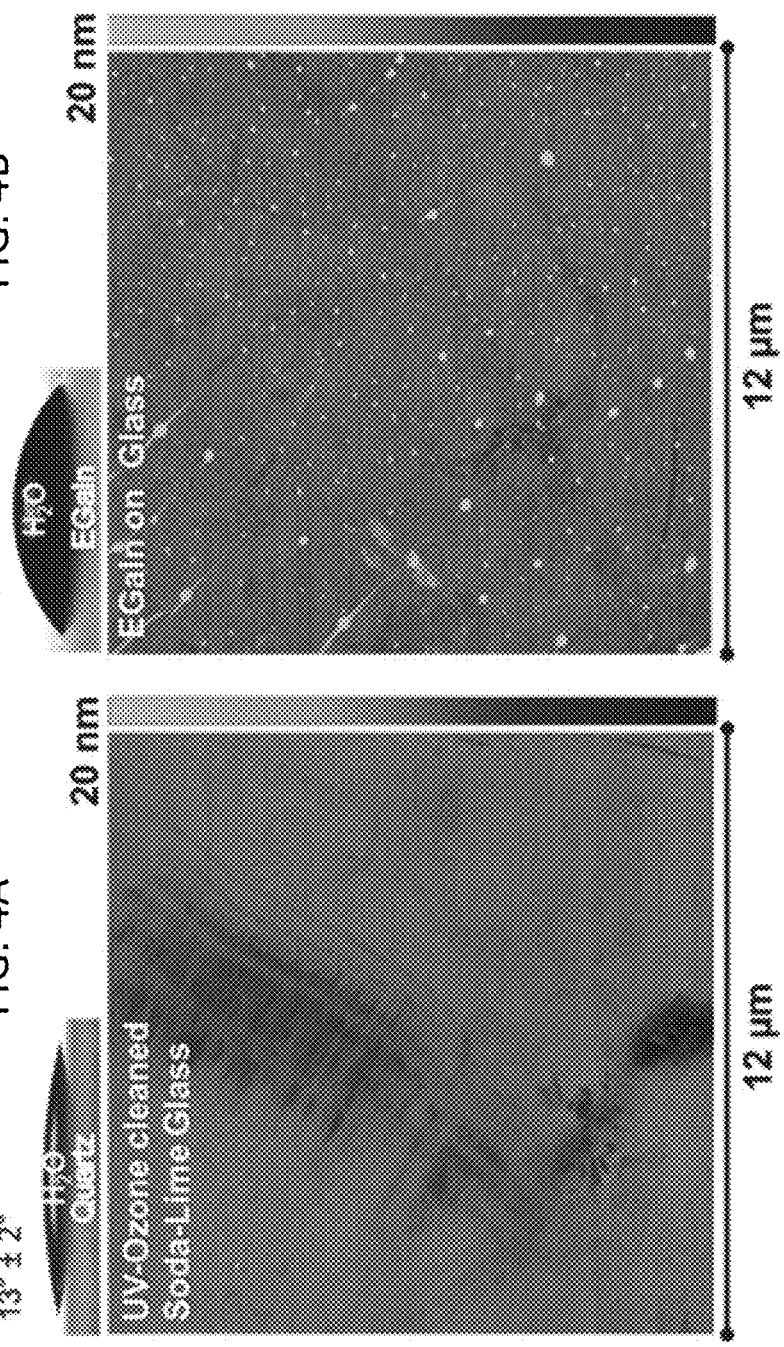

FIG. 10A  27° ± 3°   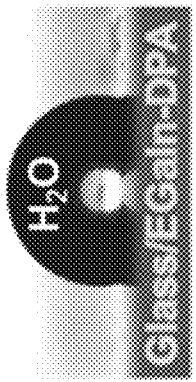  30 s Ethanol
FIG. 10B  99° ± 3°   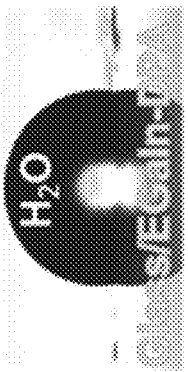  10 s 1 mM DPA
FIG. 10C  105° ± 1°  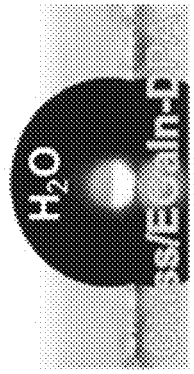  30 s 1 mM DPA
FIG. 10D  106° ± 1°  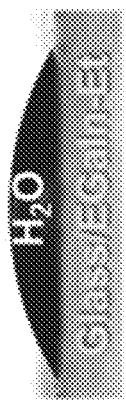  5 min 1 mM DPA
FIG. 10E  108° ± 1°  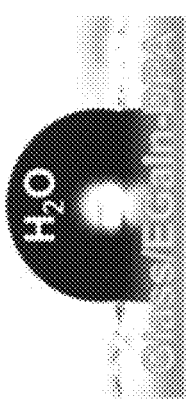  5 min 1 mM DPA
30 s Ethanol
FIG. 10F  109° ± 1°  5 min 1 mM DPA
17 hrs Ethanol

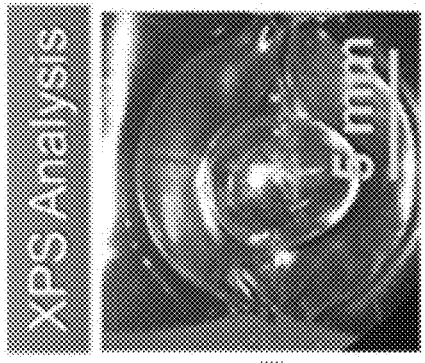
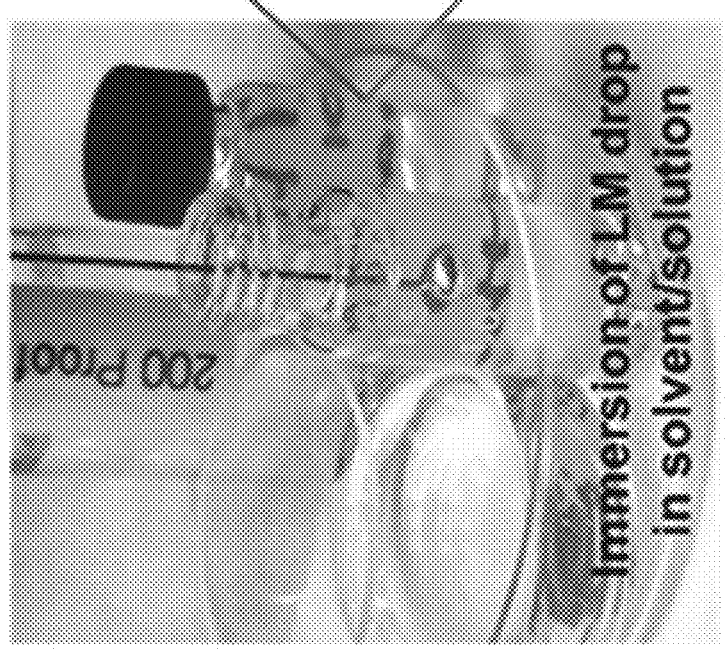
FIG. 11A
FIG. 11B
FIG. 11C

LIQUID METAL INTERFACES FOR FLEXIBLE AND RECONFIGURABLE ELECTRONICS

Pursuant to 37 C.F.R. § 1.78(a)(4), this application claims the benefit of and priority to prior filed Provisional Application Ser. No. 62/479,620, filed 31 Mar. 2017, which is expressly incorporated herein by reference.

RIGHTS OF THE GOVERNMENT

The invention described herein may be manufactured and used by or for the Government of the United States for all governmental purposes without the payment of any royalty.

FIELD OF THE INVENTION

The present invention relates generally to physically reconfigurable electronics and, more particularly, to liquid metal interfaces for flexible and reconfigurable electronics.

BACKGROUND OF THE INVENTION

Investment over the last decade to adapt electronic components from rigid constructs to agile and flexible architectures is driven by the desire to create strain-tolerant and reprogrammable systems such as wearable and reconfigurable electronics. Few materials have shown as much promise to transform these diverse technology areas as room-temperature liquid metals. These highly-conductive fluids are far superior to solid electronic materials in their mechanical flexibility and ability to physically reconfigure circuitry. While mercury (Hg) is the traditionally-referenced room temperature liquid metal ($T_{MP}$=−39° C.), its physiological and environmental toxicity restricts its use in nearly every application. Gallium liquid metal alloys (GaLMAs) are an alternative class of liquid metals, rising to prominence because of their superior properties, including non-toxic attributes, near-zero vapor pressures, and a unique ability to avoid leakage out of ruptured microchannels. Herein, the terms GaLMA, liquid metal, LM, gallium liquid, EGaIn, and Galinstan™ may be used interchangeably.

GaLMAs include numerous alloys of gallium, most notably eutectic gallium indium (EGaIn) and Galinstan™ ($T_{MP}$=15° C. and −19° C., respectively), and form a thin, viscoelastic oxide layer on their surface in oxygen concentrations as little as 1 ppm. This oxide skin is common to all GaLMAs as gallium migrates to the surface of the liquid and rapidly oxidizes, forming oxides and sub-oxides of Ga with some hydroxyls present. The instantaneous oxide formation on GaLMAs provides unmatched capabilities to create self-supporting liquid structures in free space and prevents material loss in the case of microchannel damage, unlike any other class of fluids. The oxide skin also enables the liquid to remain within small diameter, high aspect ratio microchannels at ambient pressure and does not contribute noticeably to the interface resistance between the liquid metal and solid electrical contacts.

While the rapid oxidation of GaLMA surfaces can be extremely advantageous, the lack of control over this reactive gallium interface has been the primary cause of the fluid's poor implementation into flexible and reconfigurable electronics. The two critical obstacles are as follows:

GaLMAs tend to be very "sticky" because the surface oxide adheres to various substrates and microchannel walls, resulting in deposition of fluid onto random surface areas and in detrimental locations; and Gallium aggressively alloys with every metal used in electronics, resulting in unwanted phase transitions, embrittlement of solid metal circuitry, and general lack of control of fluid location.

There is no known method of keeping the oxide and allowing it to repeatably flow through channels while maintaining a barrier between the liquid and solid metal states. The main approach reported to date to circumvent the negative "sticky" effects of the GaLMA fluids has been to use strong acids or bases to continuously etch away the oxide skin. While these methods have resulted in temporary removal of the "sticky oxide" problem, they have not yet led to practical integration of GaLMAs into useful applications for several reasons. In addition to introducing highly corrosive materials, e.g. hydrochloric acid, into an otherwise benign system, etching away the oxide forfeits all the beneficial attributes of GaLMAs detailed above. While under normal circumstances the diffusion of gallium into solid metals is slow, an acidic or basic environment substantially accelerates this diffusion process. To prevent the diffusion of gallium into other solid metal contacts, barrier layers are needed, which may detrimentally introduce additional contact resistive losses and processing steps. Better rheological control of the liquid metals in microfluidic channels and chemical stability at the liquid metal/electrode contacts is paramount to utilize these fluids to realize the game-changing capabilities in reconfigurable and flexible electronics.

Conductive traces in electronics have historically been composed of metals that are solid at room temperature, e.g. gold, silver, and copper. Lead and tin are common metals used in electronic solder. All commonly-used solder has negative characteristics including thermal expansion and contraction, which thermally limits their range of operation. There is also the concern of extremely thin crystalline growths, i.e. tin whiskers, which grow perpendicularly out from the surface of solder. Toxicity is also a concern with lead-based solder.

In electronics applications where flexibility is preferred (or essential) GaLMAs, e.g. gallium (Ga) and gallium alloys, are viable options although they too have negative characteristics. Gallium is a metal that is liquid near room temperature, making it very useful in the electronics industry, and it can maintain its intrinsic conductivity while being placed in flexible and stretchable components. Gallium and GaLMAs are also capable of self-healing, are reconfigurable, non-toxic, and stackable. These characteristics may be very useful, and both the self-healing and stackability features are due to the oxidation that occurs when gallium (Ga) and GaLMAs are exposed to oxygen (O). However, the oxide that forms can cause problems along with the benefits cited. Controlling the oxide that forms and mitigating the obstacles it presents is a challenge; current methods to overcome the obstacles have included the use of hydrochloric acid (HCl) or other acid/base chemistry which removes the oxide and its benefits, but which also adds an undesirable level of toxicity to the GaLMAs.

SUMMARY OF THE INVENTION

The present invention aims to control or mitigate the undesirable side effects of the oxide that forms on GaLMAs while maintaining the positive attributes of that oxide so that the gallium metal/GaLMAs can be used successfully to produce flexible and reconfigurable electronics.

As explained above, the spontaneous formation of a passivating oxide on these conductive fluids, i.e. liquid metals or GaLMAs, may be the most novel attribute of GaLMA materials, e.g. EGaIn, liquid metal, LM, but this property has not been exploited to date; most applications of these materials etch this oxide skin away in order to control wetting and rheological behavior. The ability to control the interfacial surface of the oxide and the oxide thickness in GaLMAs according to the present disclosure opens up new possibilities to tune the rheological behavior of these fluids in unprecedented ways. Herein, it is demonstrated how the two major barriers to integrating GaLMAs into flexible and reconfigurable electronics (stickiness and aggressive alloying) are overcome in an ambient environment by phosphonic acid (PA) modification without resulting to harsh acidic or caustic chemicals and while maintaining the advantages of the oxide skin.

The present invention overcomes the foregoing problems and other shortcomings, drawbacks, and challenges of liquid metal interfaces for flexible and reconfigurable electronics. While the invention will be described in connection with certain embodiments, it will be understood that the invention is not limited to these embodiments. To the contrary, this invention includes all alternatives, modifications, and equivalents as may be included within the spirit and scope of the present invention.

The invention is a method and use of coating the gallium oxide on the surface of GaLMAs with organic molecules, e.g. phosphonic acids, to allow for proper flow within a channel, but also to allow for a steady stream of GaLMA without breaks or gaps. The organic molecule treatment also allows for electrical connections between solid metal electrodes and the liquid gallium metal/GaLMA without the risk of atomic diffusion and alloying. The invention may be used to modify the surface of the liquid metal while maintaining, i.e. not destroying, the oxide skin, which allows self-healing of the oxidized liquid metal and manipulation into small channels. It also allows the connection and disconnection to solid metal electrodes.

According to one embodiment of the present invention, a reconfigurable electronic component comprises a channel having a first end, a second end, and outer walls surrounding and defining a lumen; a predetermined amount of a liquid phosphonic acid within the lumen; and a predetermined amount of a liquid metal within the lumen. This arrangement is advantageous in that the phosphonic acids prevent the metal oxides on the surface of the liquid metal from adhering to the lumen of the channel.

According to another embodiment, the reconfigurable electronic component further comprises a first electrical contact in communication with the lumen at the first end of the channel; and a second electrical contact in communication with the lumen at the second end of the channel. This arrangement advantageously enables the reconfigurable component to be used as a part of an electrical circuit.

According to a further embodiment, the reconfigurable electronic component further comprises a predetermined amount of a solvent within the lumen. The solvent is an aid to distribute and dilute the phosphonic acids.

According to another embodiment, the solvent comprises ethanol.

According to a further embodiment, the liquid metal comprises gallium, and the liquid metal may be selected from the group consisting of eutectic gallium indium (EGaIn) and eutectic gallium-indium-tin alloys.

According to a further embodiment, the phosphonic acid is selected from the group consisting of decylphosphonic acid (DPA), fluorobenzylphosphonic acid (FPA), and difluorobenzylphosphonic acid (DFPA). Advantageously, the particular phosphonic acid may be selected based on the desired performance characteristics of the circuit.

According to another embodiment, the first electrical contact and the second electrical contact comprise copper. Copper may be used without concern of alloying by gallium due to the intervening influence of the phosphonic acids.

According to a further embodiment, the reconfigurable electronic component may further comprise an overflow channel in fluid communication with the lumen. The overflow channel permits the apparatus to contain any displaced fluids, whether liquid metals, solvents, or phosphonic acids, especially if the circuit is flexed, bent, or stretched.

According to another embodiment, the reconfigurable electronic component may further comprise a reservoir in fluid communication with the lumen. The overflow channel permits the apparatus to contain any displaced fluids, whether liquid metals, solvents, or phosphonic acids, especially if the circuit is flexed, bent, or stretched.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention. The patent or application file contains at least one drawing executed in color. Copies of this patent or patent application publication with color drawing(s) will be provided by the Office upon request and payment of the necessary fee.

FIG. 1A depicts DPA functionalization of the surface oxide of EGaIn with atomic force microscopy (AFM) showing film growth of DPA on gallium oxide, with the height profile given along the solid black line, according to an embodiment of the invention;

FIG. 1B illustrates a topographical profile of the DPA functionalization of the surface oxide of EGaIn with in the topographical profile cross section corresponding to the location of the black line on FIG. 1A, according to an embodiment of the invention;

FIG. 1C depicts DPA functionalization of the surface oxide of EGaIn with a depiction of contact angle of water on untreated (top) and treated (bottom) gallium oxide surfaces, according to an embodiment of the invention;

FIG. 1D depicts DPA functionalization of the surface oxide of EGaIn with Ga 2p, O 1s, and P 2p binding energy (BE) regions (XPS) for EGaIn drops immersed into DPA solution with ethanol in ambient conditions (dotted line=red line) and purged by $N_2$ gas to create low oxygen environment (black line=blue line), according to an embodiment of the invention;

FIG. 2A depicts modification of GaLMA interfaces for dynamic applications with EGaIn flow through quartz capillary tubes filled with solvent alone (top) and 1 mM ethanol/DPA (bottom), according to an embodiment of the invention;

FIG. 2B depicts depicts modification of GaLMA interfaces for dynamic applications with effects of channel inner diameter size on the flow behavior of EGaIn in DPA/ethanol solution (bottom set) compared with 1 M HCl environment (top set), according to an embodiment of the invention;

FIG. 2C depicts depicts modification of GaLMA interfaces for dynamic applications with interaction of EGaIn with quartz by extrusion and withdrawal of the liquid metal in close contact with quartz substrates submerged in ethanol (top) and 1 mM DPA/ethanol (bottom), according to an embodiment of the invention;

FIG. 4A depicts AFM images of and contact angle of $H_2O$ on a bare soda lime glass, according to an embodiment of the invention;

FIG. 4B depicts AFM images of and contact angle of $H_2O$ on gallium oxide-coated glass, according to an embodiment of the invention;

FIG. 10A depicts the contact angle of $H_2O$ on the native oxide of EGaIn supported on a glass substrate after 30 s in ethanol, according to an embodiment of the invention;

FIG. 10B depicts the contact angle of $H_2O$ on the native oxide of EGaIn supported on a glass substrate after 10 s in 1 mM DPA solution, according to an embodiment of the invention;

FIG. 10C depicts the contact angle of $H_2O$ on the native oxide of EGaIn supported on a glass substrate after 30 s in 1 mM DPA solution, according to an embodiment of the invention;

FIG. 10D depicts the contact angle of $H_2O$ on the native oxide of EGaIn supported on a glass substrate after 5 min in 1 mM DPA solution, according to an embodiment of the invention;

FIG. 10E depicts the contact angle of $H_2O$ on the native oxide of EGaIn supported on a glass substrate after 5 min in 1 mM DPA solution followed by 30 s of rinse in ethanol, according to an embodiment of the invention;

FIG. 10F depicts the contact angle of $H_2O$ on the native oxide of EGaIn supported on a glass substrate after 5 minute in 1 mM DPA solution and 17 hours in ethanol, according to an embodiment of the invention;

FIG. 11A depicts sample preparation for XPS and ATR-FTIR measurements with sample DPA treatment demonstration for EGaIn drops, according to an embodiment of the invention;

FIG. 11B depicts a DPA treated EGaIn drop gently placed in a tungsten boat for XPS analysis, according to an embodiment of the invention;

FIG. 11C depicts a DPA functionalized EGaIn drop gently placed on diamond ATR crystal for FTIR measurements, according to an embodiment of the invention;

Figure 3C:
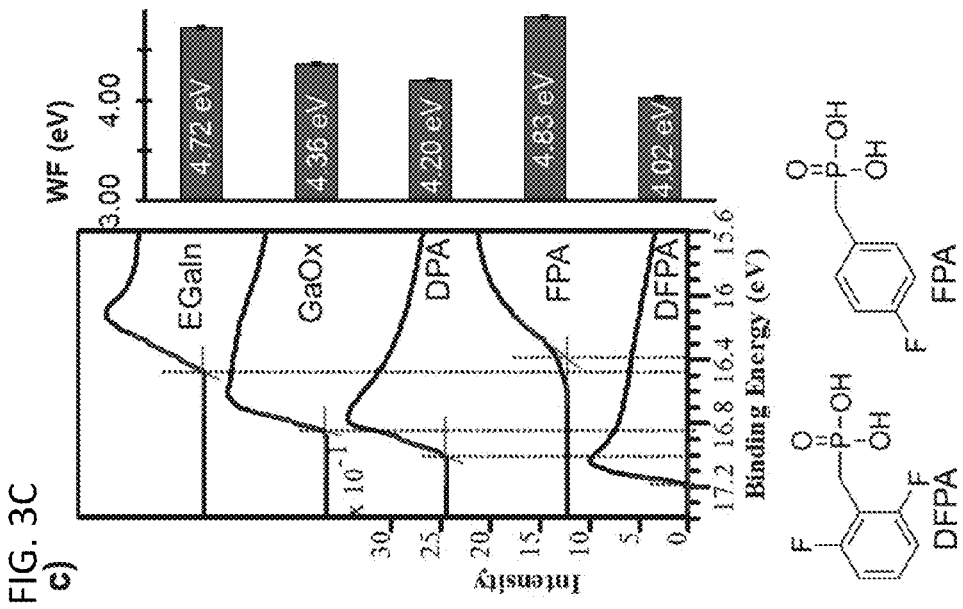
FIG. 3C depicts electronic properties of DPA-modified EGaIn interfaces with work function modification of EGaIn by decylphosphonic acid (DPA), fluorobenzylphosphonic acid (FPA), and difluorobenzylphosphonic acid (DFPA) measured by UV photoelectron spectroscopy, according to an embodiment of the invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

We present here an approach to overcome the above obstacles in ambient environments. The apparatus and method disclosed herein do not rely on removing the surface oxide and forfeiting the associated benefits of the liquid metals, e.g. GaLMAs, but instead modify the liquid metal interface, e.g. surface oxide of gallium, with phosphonic acid (PA) chemistry. The spontaneous formation of a metal oxide, i.e. $Ga_2O_3$, on the surface of the GaLMA fluids is exploited to modify the liquid metal interface with phosphonic acids. The application of phosphonic acids provides several advantages. This organic layer, i.e., phosphonic acids, (1) eliminates adhesion of the metal oxide skin to substrates, e.g. channels, while simultaneously (2) preventing gallium diffusion from the liquid metal/GaLMA into the solid metal electrodes, which preserves their electrical connectivity. Additionally, by modifying the metal oxide surfaces with phosphonic acids it is now possible to (3) control the thickness of the native surface oxide, and to (4) predictably tune the work function of the GaLMA, which opens up a wealth of new material properties in liquid gallium alloys for future exploration.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

FIG. 1A depicts atomic force microscopy (AFM) showing film growth of 1-decylphosphonic acid (DPA) on gallium oxide. The topographical height profile of the DPA film along the solid black line in FIG. 1A is illustrated in FIG. 1B. Film growth was first demonstrated with DPA on the native oxide of a common GaLMA material, eutectic gallium indium (EGaIn). A glass slide coated with EGaIn was submerged in 1 mM ethanolic solution of DPA for 30 seconds and imaged by atomic force microscopy (AFM) (see FIG. 1A) (details regarding sample preparation are provided below). With regard to FIG. 1B, the topographical height profile taken along the black solid line on the image of FIG. 1A reflects a molecular bilayer equivalent film thickness with a small concentration of multilayer structures.

FIG. 1B is a topographical profile of the black stripe at the bottom of FIG. 1A, with the left end of the stripe over the light gray region of FIG. 1A, corresponding to the 5 nm height region of FIG. 1B. The phosphate group, such as the one depicted at the top of FIG. 1B, favors adsorption to metal oxides through several bonding motifs including hydrogen bonding and covalent bonding, creating a highly stable organic layer on the inorganic surface via a facile and ambient compatible process. The "tails" of the phosphonic acid opposite the phosphate group favor engagement with the H2O.

As depicted in FIG. 1C, phosphonic acid (PA) treatment of EGaIn results in the formation of a low energy hydrophobic surface. FIG. 1C illustrates the contact angle of water on untreated (top set) and treated (bottom set) gallium oxide surfaces. The change in water contact angle on the modified gallium oxide film, from 27°±3° to 104°±1°, (FIG. 1C) validates a macroscopic surface energy change with respect to the unmodified oxide, which is tunable by judicious choice of the tail group on the phosphonic acid, and is in good agreement with the water contact angle on other DPA functionalized metal oxides. Notably, exposure times as short as 10 seconds in DPA solution made of a number of solvents, e.g. organics, oils, polar solvents, and combinations thereof, dramatically change the EGaIn surface from hydrophilic to hydrophobic (see FIGS. 4A-10F), but modification on a sub-second timescale is adequate for keeping the EGaIn from sticking to channel walls. Longer exposure further increases the hydrophobicity of the gallium oxide surface, with the largest water contact angle (most hydrophobic surface) occurring after washing the DPA coated gallium oxide surface with pure ethanol for 30 seconds.

DPA film growth on EGaIn was verified by X-ray photoelectron spectroscopy (XPS) under two different growth conditions. The Ga 2p, O 1s, and P 2p binding energy (BE) regions (XPS) are illustrated in FIG. 1D for EGaIn drops immersed in 1 mM DPA/ethanolic solution for 5 minutes under ambient conditions (red curves) and purged by $N_2$ gas to create ultra-low oxygen (blue curves) environment. A freshly formed EGaIn drop was exposed to air for 1 minute prior to submersion into DPA solution. The sample was immediately transferred into the XPS system. A second drop of EGaIn was extruded and treated by DPA inside a nitrogen glovebox (2 ppm $O_2$, 6 ppm $H_2O$) using an $N_2$ purged DPA solution. Prior to transfer to the XPS system, the treated sample was exposed to ambient environment for ~15 minutes (see FIGS. 11A-11C). Examination of the Ga 2p and O 1s regions indicated that the sample coated with DPA molecules under an ultra-low oxygen environment exhibited a much lower degree of oxidation compared with the sample prepared under ambient conditions, even after longer $O_2$ exposure after the DPAs were applied. That is, the oxide layer is much thinner than it would be without the coating of phosphonic acids.

As explained above, under ambient oxygen levels and without the use of acidic/basic media, a key hurdle of implementing GaLMAs in reconfigurable and stretchable electronics is the limited ability to physically control the movement of GaLMA fluids on surfaces without leaving oxide and metallic residues. FIG. 2A demonstrates that the presence of a DPA interface (bottom set) eliminates physical adhesion of the metal fluid to the walls of a quartz microchannel while the surface oxide is still present. FIG. 2A illustrates the modification of GaLMA interfaces for dynamic applications, with EGaIn flow through quartz capillary tubes filled with solvent alone (top) and 1 mM ethanol/DPA (bottom). Without the surface modification of the oxide (FIG. 2A top), physical adhesion between the polar GaLMA surface and the channel walls results in significant amounts of GaLMA fluid being pinched off and remaining throughout the channels as residue. It should be noted that when a quartz capillary tube was exposed to the DPA solution for 17 hours and then refilled with absolute ethanol prior to liquid metal injection, the liquid metal did not traverse the capillary tube without leaving residues. This observation indicates that the presence of PAs on the surface of EGaIn is critical to the unhindered movement of the liquid metal through the channel. Exposure of the capillary tube wall to phosphonic acids itself does not result in EGaIn that is able to move freely through the capillary tube, but exposure of the metal oxides on the EGaIn to the phosphonic acids does permit free movement of the EGaIn.

In the example of FIG. 2A, DPA and the solvent, e.g. ethanol, act together to enable residue-free flow of EGaIn in quartz capillary tubes. While the solvent carries the EGaIn slug through the channel, DPA molecules continuously adsorb to any gallium oxide that may form as more surface area is exposed during the liquid metal movement, thus protecting any newly-formed surface oxide from direct contact with and adhesion to the channel wall. Advantageously, the use of PAs also produces very few byproducts from surface reactions, unlike etching solutions that produce an ionically-conductive byproduct of hydrated salts that shorts-out or perturbs the electronic or electromagnetic functions of the microfluidic electronics. The useful lifetime of the phosphonic acid-enabled movement is also significantly longer than acid/base etching because an entirely different mechanism is used to enable non-sticking flow in the channels, where the metal oxide is allowed to grow, and then coated with an organic layer instead of traditional approaches that remove the oxide and produce byproducts and use up the reactants, after which time a continuous supply of acid/base is required to perpetually react with the ever-reforming oxide. Additionally, microfluidic systems prepared by etching treatment of liquid metals over time can lose structural stability and their electrical properties.

FIG. 2B illustrates the effects of channel inner diameter size on the flow behavior of EGaIn in DPA/ethanol solution (bottom set) compared to 1 M HCl environment (top set). The top set of FIG. 2A illustrates the negative impact of the oxides of EGaIn on the flow characteristics in the channel because of the oxide residues that remain. In a contrary manner, notice (bottom set of FIG. 2B) that the DPA-treatment of the EGaIn keeps the channels residue-free. FIG. 2C illustrates interaction of EGaIn with quartz by extrusion and withdrawal of the liquid metal in close contact with quartz substrates submerged in ethanol (top set) and 1 mM DPA/ethanol (bottom set), which top set and bottom set correspond, respectively, to the .top set and bottom set of FIGS. 2A-2B. Notice that, in the top set of FIG. 2C, that oxides of the liquid metal remain behind as the liquid metal is withdrawn into the capillary, unlike in the bottom set of FIG. 2C.

One of the benefits of the GaLMA oxide skin is that it enables the fluid to be contained within extremely small geometries, at least down to 100 um (see FIG. 2B, bottom set), without compromising its flow characteristics. It generally becomes more difficult to confine fluids to smaller channel diameters because of the increase in the Laplace pressure gradients and Plateau-Rayleigh instabilities that result in discrete drops inside the channel instead of a contiguous path. These effects are more pronounced with metallic fluids due to their inherently high surface tensions (400-700 mN/m). However the surface oxide of GaLMA balances these effects and provides mechanical stability to the fluid.

FIG. 2B illustrates EGaIn confined in various diameter channels with the oxide etched away with acid (1 M HCl solution) (top set) and with DPA modification of the EGaIn (bottom set). With regard to the top set of FIG. 2B, when the oxide of the EGaIn is etched away, the mechanical benefit is forfeited and instabilities break the GaLMA fluid into discrete sections (FIG. 2B, top set). Because DPA only modifies the gallium oxide skin without destroying it, the EGaIn remains continuously connected throughout channels as small as 100 um (FIG. 2B, bottom set). Phosphonic acid modification is also suitable for long term operation because there is no competition with the oxide formation as there is for acid/base treatments. Furthermore, the prior art method of etching the gallium oxide skin to prevent its adhesion to surfaces disadvantageously results in the loss of the self-healing properties of this liquid metal. In the absence of the oxide skin, which produces a self-sealing event at damaged channel sites, the Laplace pressure of the fluid will force it out of the damaged channels.

The protective effects of PAs at the interface of the liquid metal are further depicted in FIG. 2C, where EGaIn was extruded in close contact with a quartz substrate while the entire system was submerged in absolute ethanol (FIG. 2C, top set) and in 1 mM DPA/Ethanol (FIG. 2C, bottom set). Here, results are identical to the capillary tube experiments (see FIG. 2A), where permanent adhesion of the oxide skin to the pipette is observed as the liquid metal is retracted/withdrawn without the presence of DPAs. In contrast (see FIG. 2C, bottom set), when the DPAs are present, the DPAs prevent gallium oxide from sticking to the substrate (similar to FIG. 2A, bottom set), resulting in the full withdrawal of EGaIn without any visible residues on the pipette tip and the quartz substrate. Such behavior was not observed in the case where the quartz substrate was pretreated in 1 mM DPA solution for 17 hours and then placed in absolute ethanol environment, which demonstrates that the liquid metal itself is being treated with the PAs, not the substrate or channel surfaces.

As mentioned above, most reports utilizing GaLMAs in electronic applications have also ignored the consequences of prolonged contact between the GaLMA fluids and solid metallic electrodes. Gallium diffuses into and alloys with most solid metal contacts, which leads to the negative effects listed above, and the presence of etching acids/bases tend to accelerate this effect by putting liquid metal in direct contact with the solid metal electrodes. This alloying impairs the reversible and reliable electrical connections needed for reconfigurable and flexible electronic systems. For instance, in switching applications, atomic diffusion and adhesion between the solid and liquid metals must be prevented while maintaining adequate electrical conduction. If the liquid metal sticks to the solid electrode it will not disconnect, which prevents the GaLMA from being used in switching applications.

Figure 3A:
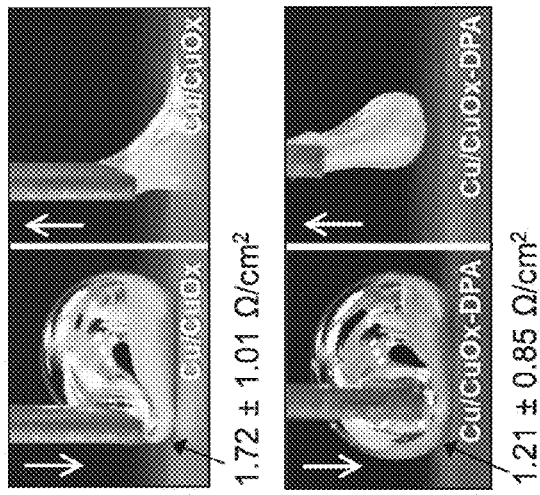
FIG. 3A depicts electronic properties of DPA-modified EGaIn interfaces with extrusion and retraction of EGaIn onto copper substrate with DPA treatment (top) and without (bottom), according to an embodiment of the invention.
Figure 3B:
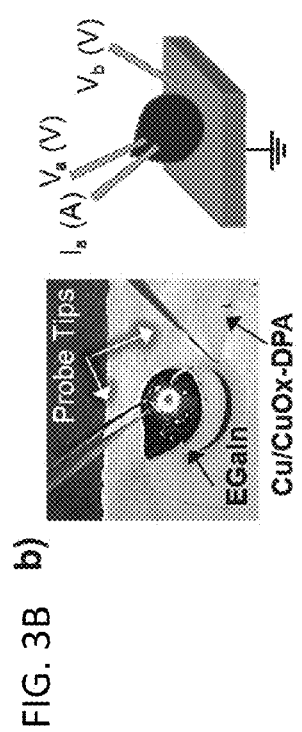
FIG. 3B depicts the 4 point probe for measuring the contact resistance of the EGaIn/Cu interfaces for determining the electronic properties of DPA-modified EGaIn interfaces of FIG. 3A, according to an embodiment of the invention.
Figure 14:
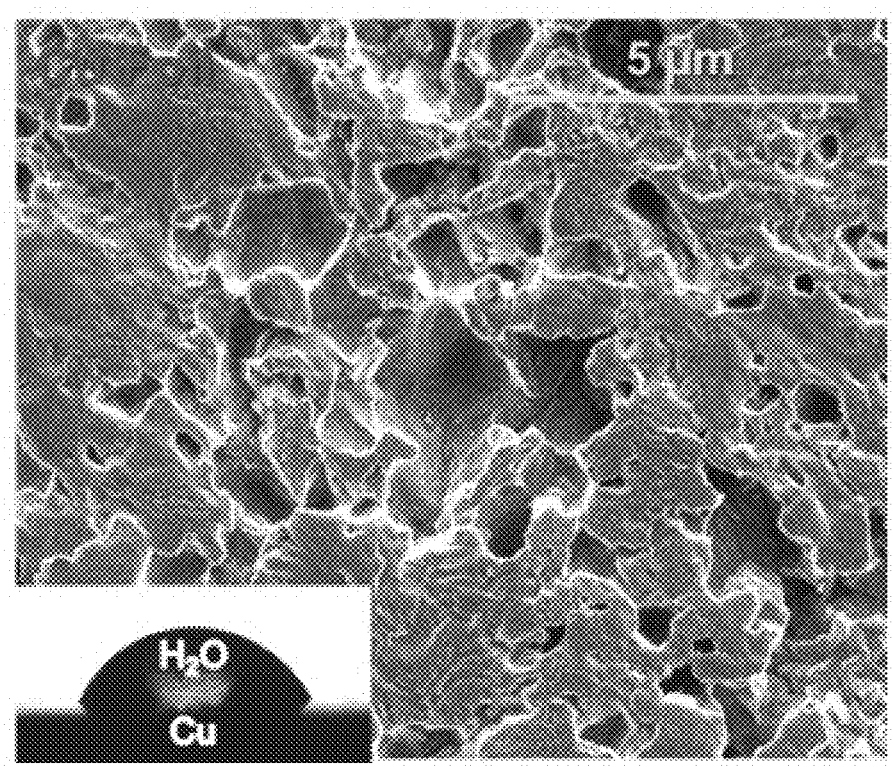
FIG. 14 depicts SEM of copper foil (solvent cleaned) and contact angle of $H_2O$ on the same substrate, according to an embodiment of the invention.
Figure 15:
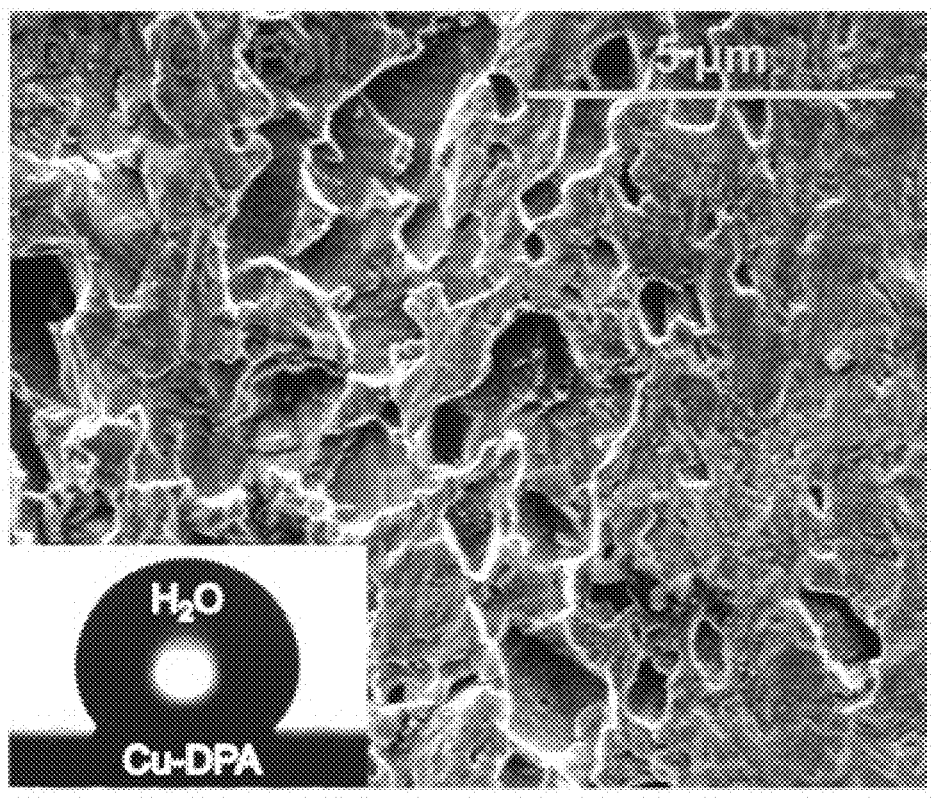
FIG. 15 depicts SEM of DPA functionalized copper foil and contact angle of $H_2O$ on the same substrate, according to an embodiment of the invention.
Figure 16D:
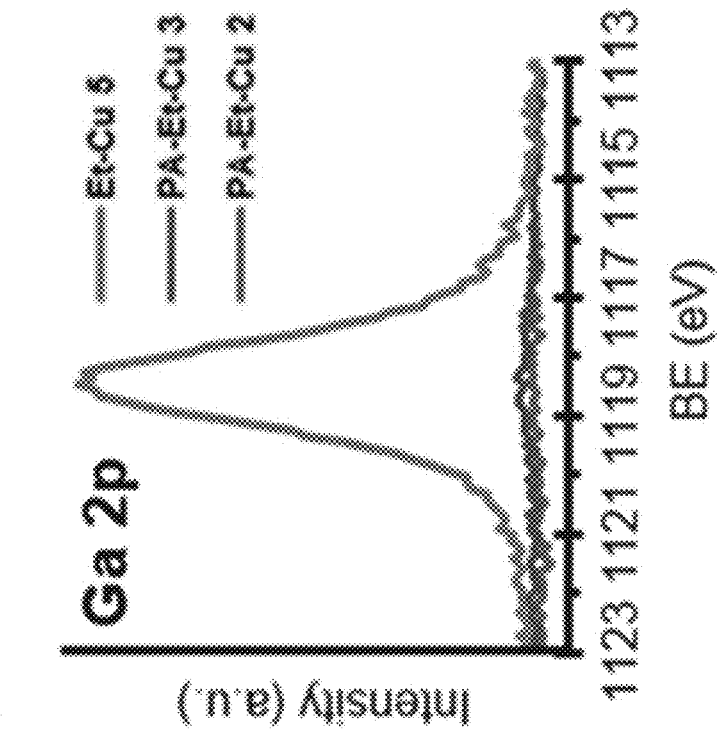
FIG. 16D illustrates an XPS of the copper wire surfaces showing sufficient amounts of gallium present when DPAs are not present (corresponding to FIG. 16A), and negligible gallium detected with the presence of DPAs (corresponding to FIGS. 16B-16C), according to an embodiment of the invention.
Figure 16A:
FIG. 16A depicts an image of a copper wire submerged in eGaIn in a bath of ethanol after four days, according to an embodiment of the invention.
Figure 16B:
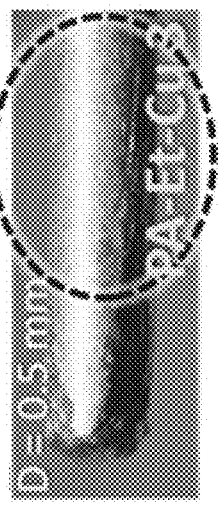
FIG. 16B depicts an image of a copper wire submerged in eGaIn in a bath of DPA/ethanol after four days, according to an embodiment of the invention.
Figure 16C:
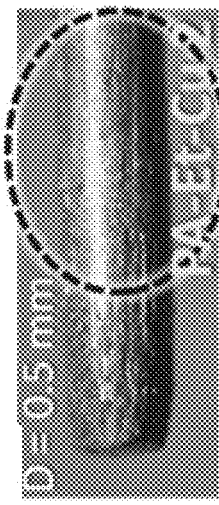
FIG. 16C depicts an image of another copper wire submerged in eGaIn in a bath of DPA/ethanol after four days, according to an embodiment of the invention.

FIGS. 3A-3C illustrate electronic properties of DPA-modified EGaIn interfaces. FIG. 3A illustrates extrusion and retraction of EGaIn onto a copper substrate with (bottom set) and without (top set) DPA treatment, similar to FIG. 2C. Contact resistances of the EGaIn/Cu interfaces were measured by a 4-point probe, such as depicted in FIG. 3B. Regarding FIGS. 3A-3C, adhesion of EGaIn to copper was tested by extruding the liquid metal directly onto Cu foils in the presence of DPA molecules (FIG. 3A, bottom set) and the absence of DPA molecules (FIG. 3A, top set). Withdrawal of the liquid metal shows permanent adherence at untreated interfaces (FIG. 3A, top set), while the liquid metal releases from the copper foil in the presence of DPAs without any visible residues (FIG. 3A, bottom set), which demonstrates that phosphonic acid treatment protects the copper from alloying with the EGaIn. Scanning electron microscopy images of copper, both with and without DPA treatment, show similar microscopic morphologies (see FIGS. 14-15) and XPS of DPA treated copper surfaces show no gallium signatures (see FIGS. 16B-16D), suggesting that surface chemistry plays an important role in creating non-adhesive contact with the liquid metal. The interface resistances of both junctions were measured using a 4-point probe set-up (see FIG. 3B) to eliminate contributions to the resistance other than the EGaIn/EGaIn Oxide/DPA/Cu Oxide/Cu interface. Drops of EGaIn of equivalent volumes (~25 µL) were placed on a copper foil with and without DPA at the interface and measurements were taken with identical probe tip geometries (see FIG. 3B) and no measureable difference was recorded in the specific contact resistivity of the two EGaIn/copper junctions.

In addition to controlling surface wettability, phosphonic acids may also be utilized to modulate the work function of transparent metal oxides. Surface treatment of metal oxides is important in thin film applications containing hybrid interfaces, such as organic photovoltaics and organic light emitting diodes, where poor interface engineering can lead to delamination, undesired morphologies, and degraded device efficiencies. EGaIn and other GaLMA fluids are excellent materials to serve as flexible and stretchable electrodes for thin film devices, but tuning the surface electronic properties has not been possible to date, limiting their application.

FIG. 3C illustrates work function modification of EGaIn by decylphosphonic acid (DPA), fluorobenzylphosphonic acid (FPA), and difluorobenzylphosphonic acid (DFPA), measured by UV photoelectron spectroscopy. Regarding FIG. 3C, work function tunability of EGaIn is demonstrated. In FIG. 3C, several PA molecules (2,6-difluorobenzylphosphonic acid (DFPA), 4-fluorobenzylphosphonic acid (FPA), and DPA) are used to shift the work function of EGaIn to both higher and lower values, as measured by UV photoelectron spectroscopy (UPS). The measured work function values are in excellent qualitative agreement with PA-modified ITO. The changes to the R groups are equivalent to those demonstrated on ITO. The tunability of the work function of EGaIn by as much as 800 meV allows optimization of the electrodes for flexible and stretchable electronics.

FIG. 4A depicts AFM images of and contact angle of $H_2O$ on a bare soda lime glass, and FIG. 4B depicts AFM images of and contact angle of $H_2O$ on gallium oxide-coated glass. The change in $H_2O$ contact angles is evident.

Figure 5A:
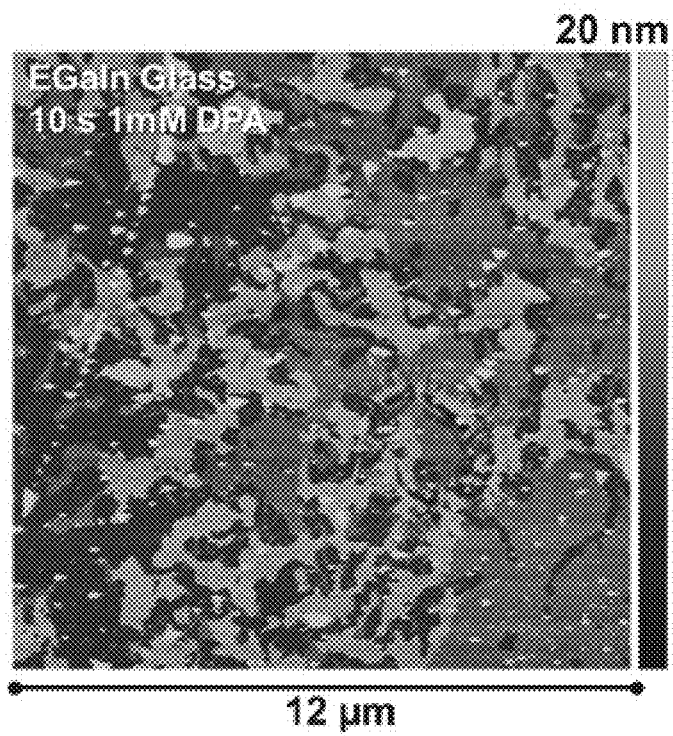
FIGS. 5A-5B depict AFM images of DPA film growth on the native oxide of EGaIn after 10 seconds of exposure to 1 mM ethanolic solution, according to an embodiment of the invention.
Figure 5B:
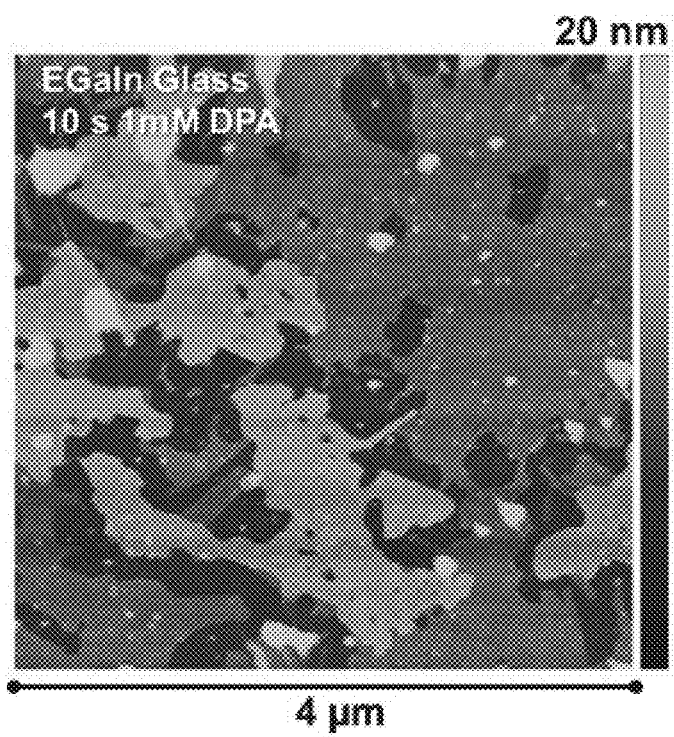

FIGS. 5A-5B depict AFM images of DPA film growth on the native oxide of EGaIn after 10 seconds of exposure to 1 mM ethanolic solution.

Figure 6A:
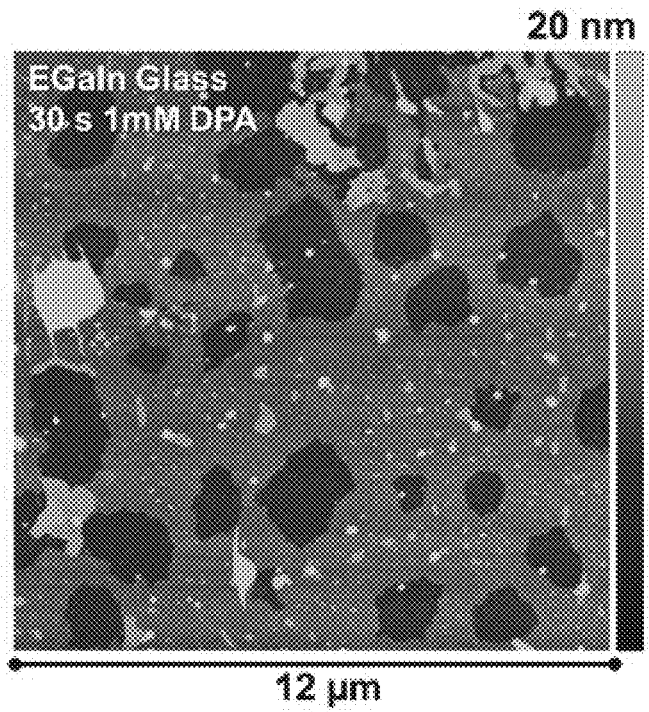
FIGS. 6A-6B depict AFM images of DPA film growth on the native oxide of EGaIn after 30 seconds of exposure to 1 mM ethanolic solution, according to an embodiment of the invention.
Figure 6B:
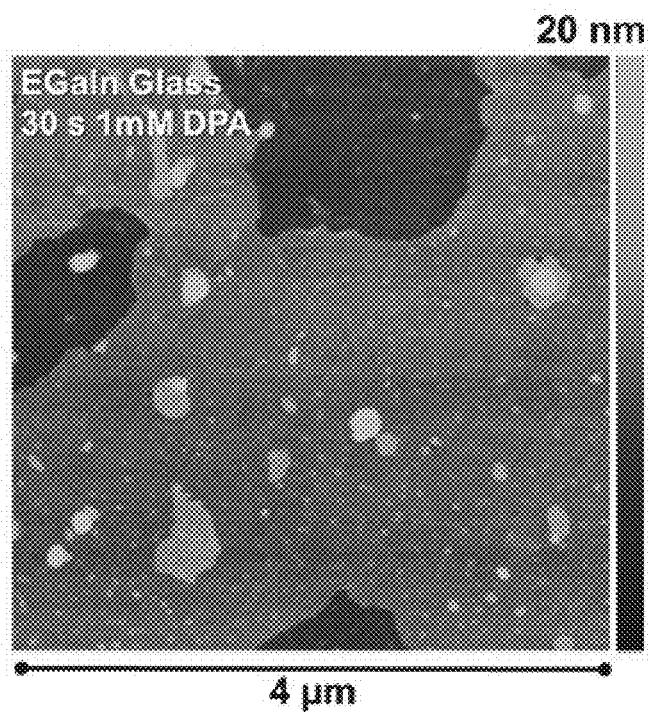

FIGS. 6A-6B depict AFM images of DPA film growth on the native oxide of EGaIn after 30 seconds of exposure to 1 mM ethanolic solution.

Figure 7A:
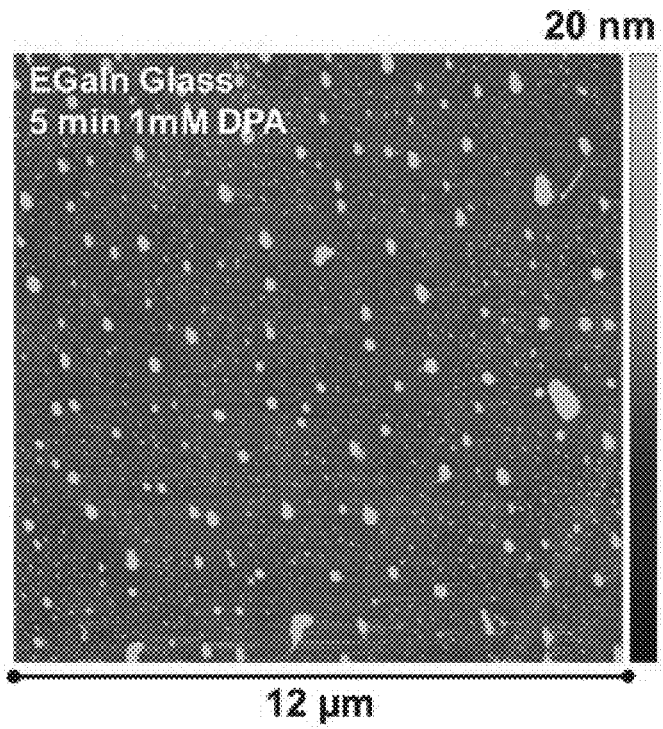
FIGS. 7A-7B depict AFM images of DPA film growth on the native oxide of EGaIn after 5 minutes of exposure to 1 mM ethanolic solution, according to an embodiment of the invention.
Figure 7B:
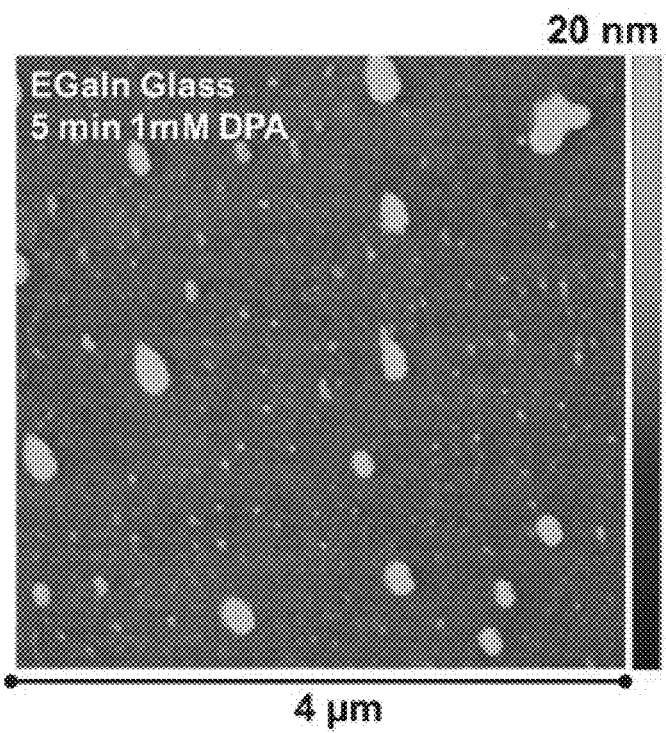

FIGS. 7A-7B depict AFM images of DPA film growth on the native oxide of EGaIn after 5 minutes of exposure to 1 mM ethanolic solution. FIGS. 5A-7B demonstrate the speed at which the PA films are created on the substrate. Notice that the films are blotchy at the shorter time periods (i.e., 5 and 10 seconds), but the film is very evenly developed at 30 seconds.

Figure 8A:
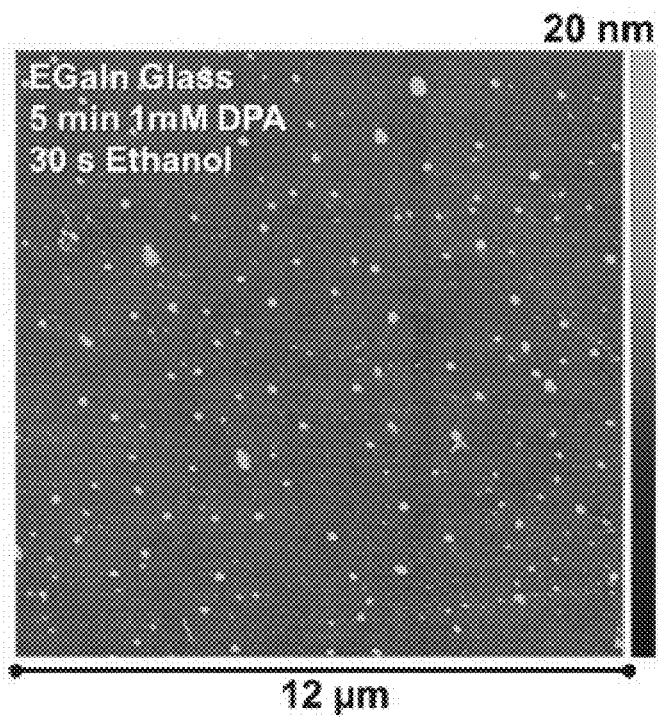
FIGS. 8A-8B depict AFM images of DPA film growth on the native oxide of EGaIn after 5 minutes of exposure to 1 mM ethanolic solution followed by 30 seconds of rinse with ethanol, according to an embodiment of the invention.
Figure 8B:
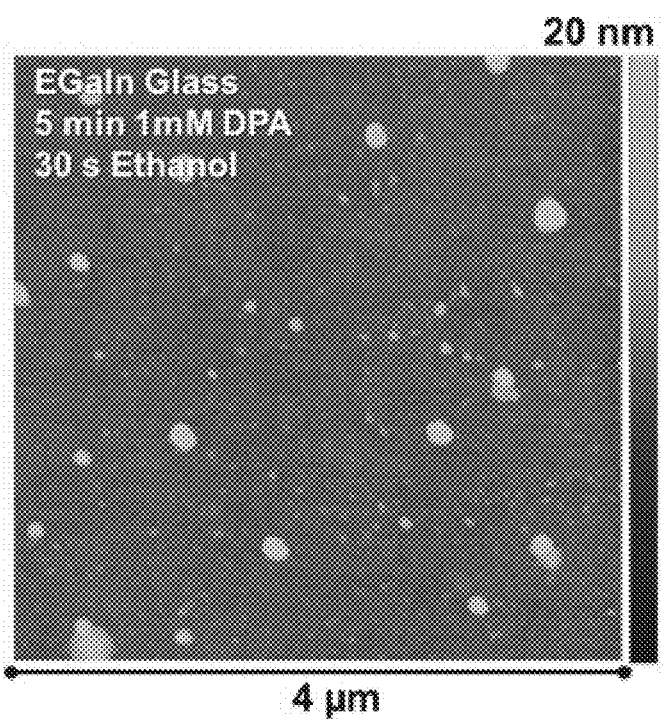

FIGS. 8A-8B depict AFM images of DPA film growth on the native oxide of EGaIn after 5 minutes of exposure to 1 mM ethanolic solution followed by 30 seconds of rinse with ethanol. FIGS. 8A-8B demonstrate the film formation on glass with DPA and ethanol.

Figure 9A:
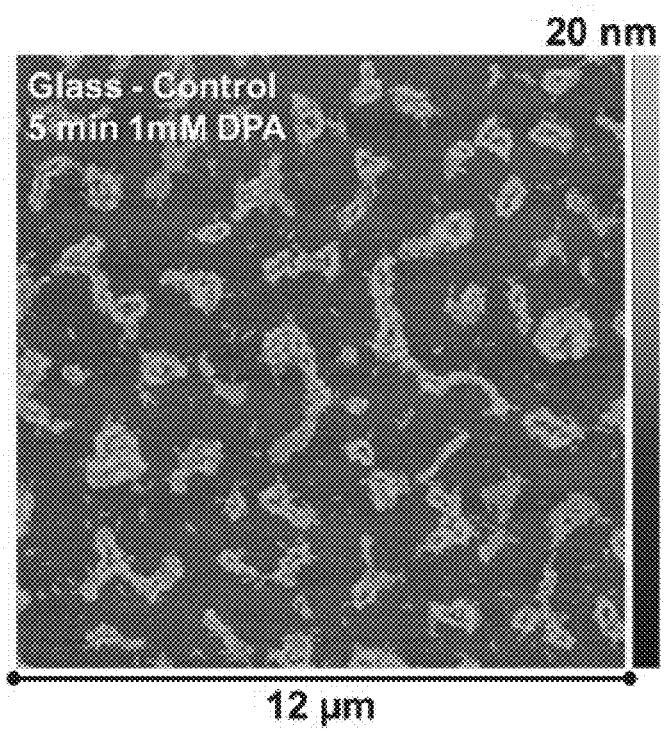
FIG. 9A depicts AFM images of DPA film growth on the bare soda lime glass (control experiment) after 5 minutes of exposure to 1 mM ethanolic solution, according to an embodiment of the invention.
Figure 9B:
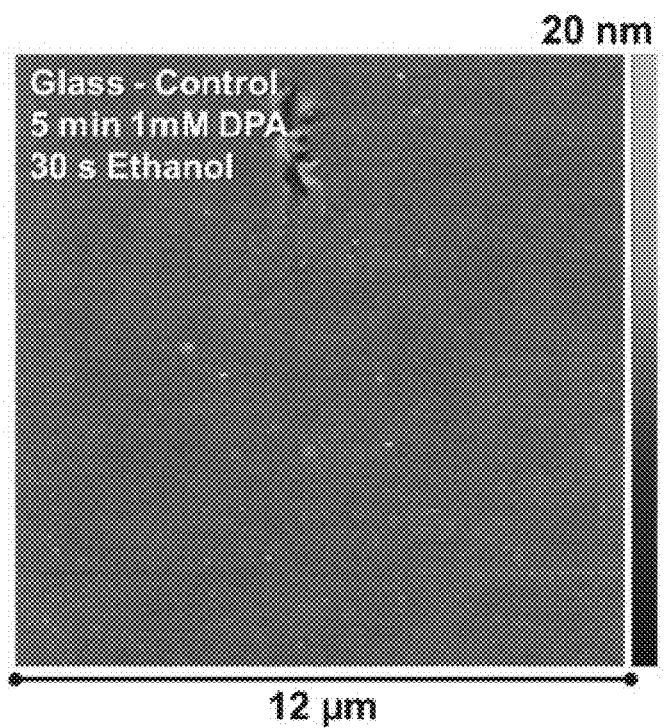
FIG. 9B depicts the control experiment of FIG. 9A after 30 seconds of rinse with ethanol, according to an embodiment of the invention.

FIG. 9A depicts AFM images of DPA film growth on the bare soda lime glass (control experiment) after 5 minutes of exposure to 1 mM ethanolic solution, and FIG. 9B depicts the control experiment of FIG. 9A after 30 seconds of rinse with ethanol. FIGS. 9A-9B demonstrate that glass does not cover well, i.e. film development is poor.

FIG. 10A depicts the contact angle of $H_2O$ on the native oxide of EGaIn supported on a glass substrate after 30 s in ethanol; FIG. 10B depicts the contact angle of $H_2O$ on the native oxide of EGaIn supported on a glass substrate after 10 s in 1 mM DPA solution; FIG. 10C depicts the contact angle of $H_2O$ on the native oxide of EGaIn supported on a glass substrate after 30 s in 1 mM DPA solution; FIG. 10D depicts the contact angle of $H_2O$ on the native oxide of EGaIn supported on a glass substrate after 5 min in 1 mM DPA solution; FIG. 10E depicts the contact angle of $H_2O$ on the native oxide of EGaIn supported on a glass substrate after 5 min in 1 mM DPA solution followed by 30 s of rinse in ethanol; and FIG. 10F depicts the contact angle of $H_2O$ on the native oxide of EGaIn supported on a glass substrate after 5 minute in 1 mM DPA solution and 17 hours in ethanol. The progression from FIG. 10A-10F illustrates the change in the surface properties of the EGaIn according to its treatment with DPA.

EXPERIMENTAL

Materials: All phosphonic acids (PAs) were used without further purification. 1-decylphosphonic acid (DPA) was purchased from Lancaster Synthesis, Inc. 4-fluorobenzylphosphonic acid (FPA) and 2,6-difluorobenzylphosphonic acid (DFPA) were purchased from Sigma Aldrich. Prior to use, 1 mM ethanolic solutions of PAs were sonicated for at least 10 minutes and filtered through Whatman™ inorganic membrane (Anotop™ 10, 10 µm). For XPS analysis, EGaIn was purchased from Sigma Aldrich (>99.99%). All other experiments were carried out using EGaIn prepared by mixing gallium (GalliumSource, 99.99%) and indium (Gallium-Source, 99.99%) at the eutectic composition.

AFM: EGaIn drops were dispensed onto clean microscope glass slides and spread by a single stroke. These slides were then immersed into ethanolic solution of DPA at various exposure times, as explained below. AFM images were taken both on areas having the gallium oxide film as well as the uncoated glass slide for comparison (Veeco Dimension 3100 Ambient AFM).

Contact Angle Measurements: Samples prepared for AFM analysis was also used for contact angle measurements (Biolin Scientific, Attension).

XPS: All spectra were collected at room temperature using a Surface Science Instruments M-Probe spectrometer with a monochromatic Al Kα X-ray source (1486 eV) of 800 µm beam spot size and a base pressure of $<2\times10^{-9}$ Torr. The analyzer was oriented at 35° relative to the sample surface. For elemental composition analysis, survey spectra were acquired with pass energy of 150 eV. High resolution spectra for specific binding regions were scanned at pass energy of 25 eV. The system was controlled by ESCA25 Capture software v5.01.03 (Service Physics, Bend Oreg.). ESCA25 Analysis software v5.01.02 was used to determine the atomic compositions. Some more detailed analysis is provided below.

Electrical Measurements: Contact resistance of EGaIn drops on bare copper and DPA functionalized copper were measured by Keithley 4200 using the CascadeMicrotech probe station.

UPS: Work function values were determined by UV photoelectron spectroscopy (Kratos AXIS Ultra DLD) equipped with a helium discharge lamp (He I, 21.22 eV). A sample bias of −5 V was applied to accelerate electrons. All spectra were acquired at a pass energy of 5 eV with instrumental resolution of 86 meV. Samples were prepared by exposing drops of EGaIn to air for 1 minute followed by immersion into 1 mM ethanolic solutions of PAs for 5 minutes. The liquid metal drops were then placed in ethanol bath for 1.5 hours to remove loosely bound PAs and immediately transferred to the UPS chamber.

Atomic Force Microscopy Analysis

AFM images on the surface of the liquid metal drop were not able to be acquired because the liquid nature of the core material introduces mechanical instability during measurements. Therefore, it was important that the images were taken on the oxide surface without the liquid core underneath. A native oxide skin of EGaIn on microscope glass slides was obtained by placing a drop of EGaIn on each glass slide followed by gently spreading the drop across the surface. Due to its high surface tension, EGaIn retracted to a semispherical shape, leaving behind its oxide skin on the glass slide. Most of the retracted liquid drop was then removed using a syringe. The substrates were then immersed into 1 mM ethanolic solution of decylphosphonic acid (DPA) and then dried in air (see below). All samples were stored in inert ($N_2$) environment and were analyzed within three days. For verification purposes, control experiments were carried out on the bare glass substrate and the gallium oxide-coated glass both with and without DPA treatment (see FIGS. 9A-9B). The contact angle of $H_2O$ on these samples indicates abrupt changes to the surface energy of gallium oxide skin of EGaIn with DPA treatment (see FIGS. 10A-10F). The gallium oxide surface becomes hydrophobic with DPA treatment within 10 seconds. Immersion of the DPA-treated sample into an ethanol bath for a prolonged period (17 hours) did not change the hydrophobicity of the surface, which indicates strong interaction (binding) between the molecules and the oxide (see FIG. 10F).

Spectroscopic Analysis (XPS and ATR-FTIR)

Sample Preparation: EGaIn was extruded by a syringe and the resulting liquid drop was suspended on the syringe needle tip for DPA treatment (see FIGS. 11A-11C). Following immersion into a DPA solution, the suspended EGaIn drop was removed from the solution and dried in air. For X-ray photoelectron spectroscopy (XPS) measurements, the suspended drop was held in air for 1 minute prior to DPA treatment. Upon removal from the DPA solution, the liquid metal drop was held in air for additional time (1 min) to dry and then gently placed inside a tungsten boat and immediately transferred into the XPS system. For attenuated total reflection FTIR (Fourier transform infrared spectroscopy) measurements (ATR-FTIR), the suspended EGaIn drop was removed from the solution, dried in air for 2 minutes, and gently placed on the ATR crystal (diamond) for analysis in ambient conditions (Bruker, Alpha Platinum ATR-FTIR).

Figure 12:
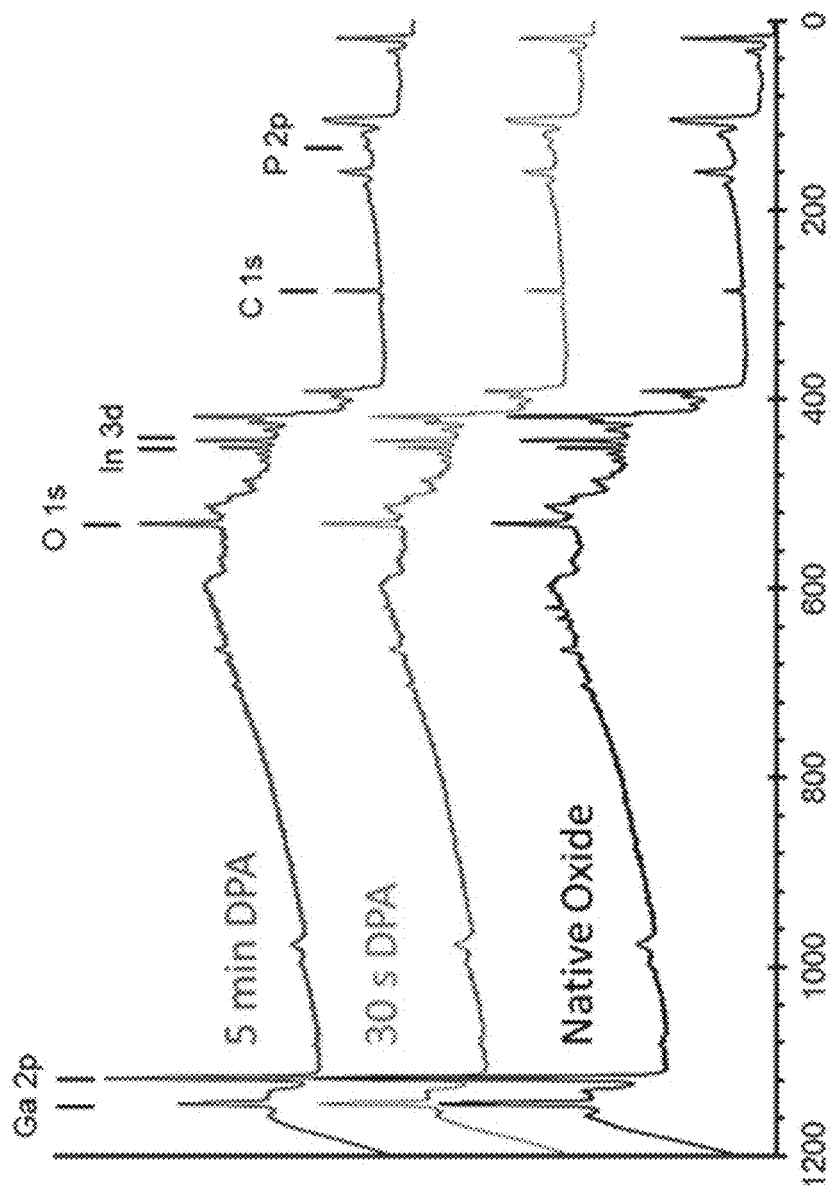
FIG. 12 illustrates XPS survey spectra of EGaIn samples: native oxide (bottom curve), immersed into DPA solution (1 mM in ethanol) for 30 seconds (middle curve) and 5 minutes (top curve), according to an embodiment of the invention.

XPS Analysis: Survey spectra are shown in FIG. 12 for three types of EGaIn samples: EGaIn with its native oxide (black, bottom curve), EGaIn exposed to 1 mM ethanolic solution of DPA for 30 seconds (red, middle curve), and EGaIn exposed to 1 mM ethanolic solution of DPA for 5 minutes (blue, top curve). A major peak for each element is labeled. All spectra are normalized with respect to the baseline in the 50-400 eV region. Ga 2p peak intensity decreases with DPA treatment with the lowest intensity for a 5 minute exposure time. Similarly, C 1s peak intensity increases with DPA film growth. O 1s has contributions from both the gallium oxide skin and the phosphate group of the molecules. P 2p is the evidence for the presence of the DPA molecules on the liquid metal drop. Atomic composition analysis is given for each survey spectrum in Supplementary Table 1, below.

SUPPLEMENTARY TABLE 1

Atomic composition analysis of EGain with its native oxide and after exposure to mM solution for 30 seconds and 5 minutes.

|    | Native Oxide | 30 s DPA | 5 min DPA |
|----|--------------|----------|-----------|
| Ga | 49.1%        | 34.4%    | 27.2%     |
| In | 5.7%         | 4.5%     | 4.4%      |
| O  | 32.0%        | 30.5%    | 32.5%     |
| C  | 13.2%        | 25.8%    | 30.8%     |
| P  | 0.0%         | 2.4%     | 2.5%      |

Figures 13A, 13B, 13C:
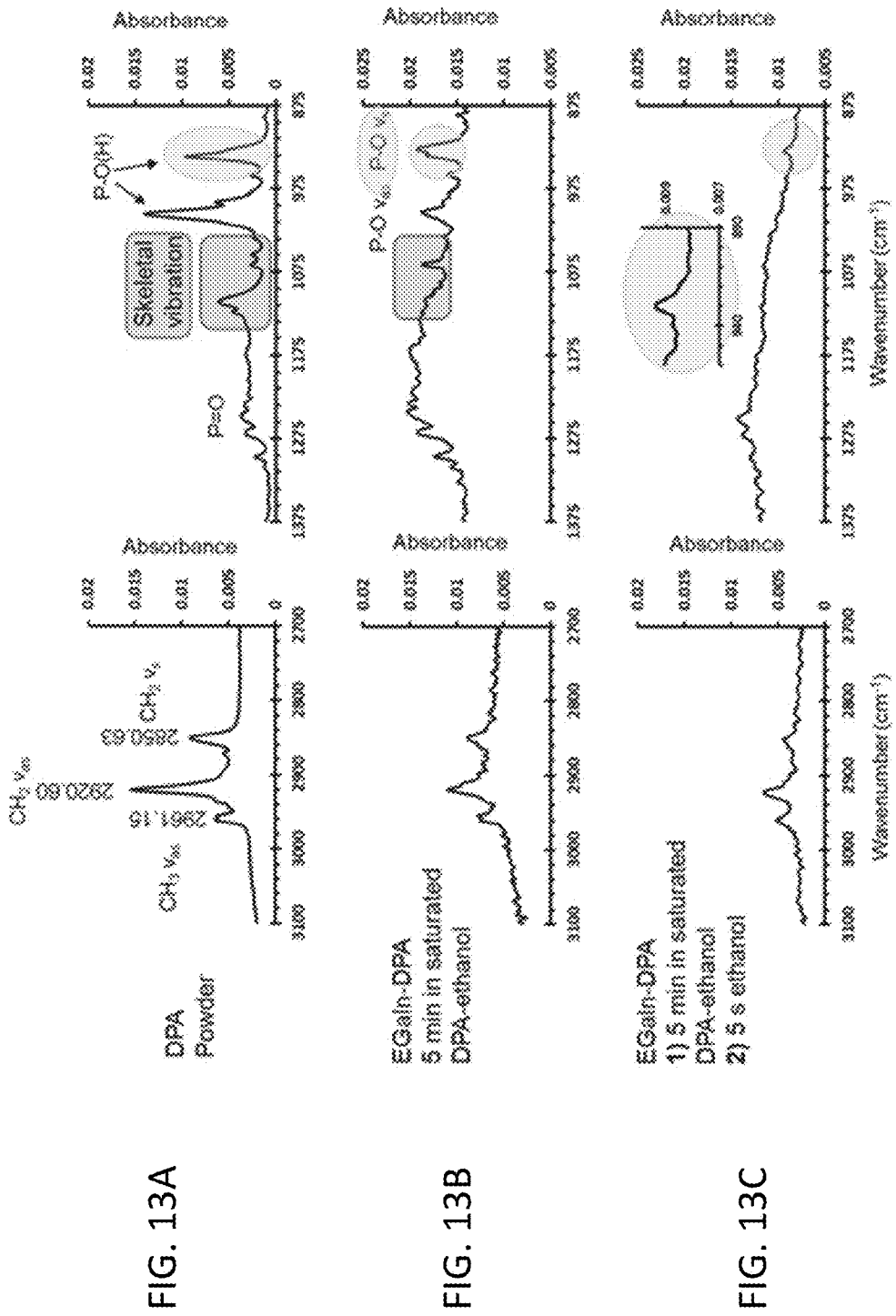
FIG. 13A depicts ATR-FTIR spectra of DPA molecules on EGaIn: reference spectra for DPA molecules alone, according to an embodiment of the invention.
FIG. 13B depicts ATR-FTIR spectra of DPA molecules on EGaIn; EGaIn drop exposed to saturated solution of DPA for 5 minutes, according to an embodiment of the invention.
FIG. 13C depicts ATR-FTIR spectra of DPA molecules on EGaIn: EGaIn drop exposed to saturated solution of DPA for 5 minutes, and later rinsed with ethanol for 5 seconds, according to an embodiment of the invention.

ATR-FTIR Analysis: Molecular fingerprint of DPA on EGaIn drops were confirmed by ATR-FTIR measurements. In FIG. 13A, reference spectra are shown for the DPA molecules alone (powder form). The presence of these molecules on the surface of EGaIn drop is evidenced by ATR-FTIR measurements, in FIG. 13B. Here, the EGaIn drop was immersed into a saturated ethanolic solution of DPA. The spectrometer becomes less sensitive as the film coverage decreases (see FIG. 13C) after the sample was rinsed with ethanol for 5 seconds. Vibrational modes in the 2,800-3,000 $cm^{-1}$ region correspond to the symmetric and asymmetric stretching modes of the alkyl chain. Skeletal vibration (molecular vibration) modes and P-O bending and stretching modes are observed in the lower wavenumber regions.

Scanning Electron Microscopy

Surface morphology of solvent-cleaned (FIG. 14) and DPA functionalized (FIG. 15) copper foils showed no obvious differences within the spatial resolution of the microscope. The contact angle of water was also observed on both substrates.

In summary, chemical modification of the oxide skin of eutectic gallium indium (EGaIn) by phosphonic acids is useful to (i) control residue-free movement of the liquid metal through capillary channels with the oxide intact, (ii) create reversible electrical contact with copper, and (iii) tune its work function by up to 800 meV. Phosphonic acids readily bind to the native oxide of the eutectic alloy of gallium and indium (EGaIn) as confirmed by XPS, AFM, and contact angle measurements, and provide a favorable surface for electronic applications.

Advantageously, phosphonic acids as interface modifiers for gallium liquid metal alloys (GaLMAs) were demonstrated to control the physical, chemical, and electronic behavior of the fluid for application areas such as reconfigurable electronics, flexible circuits, stretchable electrodes, and thin film devices containing hybrid interfaces. Without treatment, GaLMA fluids adhere to and/or react with most surfaces, resulting in metallic deposits in undesired locations, and in unpredictable and irreproducible electronic and electromagnetic properties. Phosphonic acid surface modification of GaLMAs allows the liquid metal to form stable structures in small-dimension microchannels, to flow for extended periods of time without metallic residue formation, and to protect against alloying with metallic electrodes. Additional control of the EGaIn surface properties was demonstrated by controlling the thickness of its oxide skin in ambient environments which will affect its mechanical and rheological properties. Finally, tunability of the work function of EGaIn was demonstrated by prudent choice of the phosphonic acid tail group, which has implications for flexible hybrid thin film applications. Ultimately, the use of phosphonic acids to modify the surface of liquid gallium alloys represents a novel paradigm shift in overcoming previous obstacles to their implementation into stretchable/flexible and reconfigurable electronics in ambient operational environments.

Applications of this technology are wide and varied, to include programmable self-destructing circuit boards; anti-espionage, reprogrammable circuit boards; Braille/touchable items using the stackability of the oxidized Ga, including moldable jewelry; electronic switches and relays using gallium liquid metal; medical uses, e.g. biomarker sensors, activating switches, insulin pumps, and drug delivery; self-healing qualities can be used for scratch repair in coatings and paints and electronics; heat-sensitive qualities can be used in sensors and thermometers; and nanoparticle colloidal inks used for additive manufacturing and 3D printing of liquid metals.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A reconfigurable electronic component comprising
a channel having a first end, a second end, and outer walls surrounding a lumen;
a predetermined amount of a liquid phosphonic acid within the lumen; and
a predetermined amount of a liquid metal within the lumen.

2. The reconfigurable electronic component of claim 1, further comprising
a first electrical contact in communication with the lumen at the first end of the channel; and
a second electrical contact in communication with the lumen at the second end of the channel.

3. The reconfigurable electronic component of claim 1, further comprising a predetermined amount of a solvent within the lumen.

4. The reconfigurable electronic component of claim 3, wherein the solvent comprises at least one of ethanol, oleic acids, decanes, and alcohols.

5. The reconfigurable electronic component of claim 1, wherein the liquid metal comprises gallium.

6. The reconfigurable electronic component of claim 1, wherein the liquid metal is selected from the group consisting of eutectic gallium indium (EGaIn), eutectic gallium-indium-tin alloys, gallium-based liquid metals, including those gallium-based LMs alloyed with aluminum and gold.

7. The reconfigurable electronic component of claim 1, wherein the phosphonic acid is selected from the group consisting of decylphosphonic acid (DPA), fluorobenzylphosphonic acid (FPA), difluorobenzylphosphonic acid (DFPA), octadecylphosphonic (ODPA).

8. The reconfigurable electronic component of claim 1, wherein the first electrical contact and the second electrical contact comprise at least one of copper (Cu), aluminum (Al), silver (Ag), and gold (Au).

9. The reconfigurable electronic component of claim 1, further comprising an overflow channel in fluid communication with the lumen.

10. The reconfigurable electronic component of claim 1, further comprising a reservoir in fluid communication with the lumen.

* * * * *